United States Patent [19]

Chiu et al.

[11] Patent Number: 4,639,664

[45] Date of Patent: Jan. 27, 1987

[54] APPARATUS FOR TESTING A PLURALITY OF INTEGRATED CIRCUITS IN PARALLEL

[75] Inventors: Anthony M. Chiu, Richardson, Tex.; Mark D. Allison, Boise, Id.; James W. Jones, Singapore, Singapore; Lyndale A. Trammell, Baguio City, Philippines; Fock San Ho, Singapore, Singapore

[73] Assignee: Texas Instruments Incorporated, Dallas, Tex.

[21] Appl. No.: 615,979

[22] Filed: May 31, 1984

[51] Int. Cl.$^4$ .......................... G01R 31/28; B07C 5/00
[52] U.S. Cl. ............................... 324/73 AT; 209/573; 324/73 R
[58] Field of Search ............ 324/73 R, 73 AT, 158 F; 209/571, 573

[56] References Cited

U.S. PATENT DOCUMENTS 4,509,008  4/1985  Das Gupta et al. .............. 324/73 R

OTHER PUBLICATIONS

Lawrence, Jr., J. D.; "Parallel Test with . . . "; Microelectronic Manufacturing and Testing; Jan. 1982; pp. 22–25.
Loranger, A.; "The Hot Aspects of Burn-In"; Electronics Test; Feb. 1984; pp. 40–42, 46, 48, 50, 52.
Parallel Systems Advertisement; "Parallel/Multi-Test Site . . . "; Parallel Systems, Santa Clara, Calif. 95051; no date.
Sym-Tek Systems, Inc. Advertisement; "System 340 QUAD"; Sym-Tek Systems, Inc., San Diego, Ca. 92123; no date.
Daymarc Corporation Advertisement; "Daymarc '757 Quadsite"; Daymarc Corporation, Waltham, Mass. 02154; no date.
Parallel Systems Advertisement; "Introducing the 24 Test . . . "; Parallel Systems, Santa Clara, Calif. 95051; no date.

*Primary Examiner*—Ernest F. Karlsen
*Attorney, Agent, or Firm*—Richard A. Bachand; N. Rhys Merrett; Melvin Sharp

[57] ABSTRACT

In accordance with a broad aspect of the invention, a system is presented for parametrically and functionally testing integrated circuit devices in parallel. At least one integrated circuit device receiving channel is provided for defining a plurality of integrated circuit device test stations therealong, and means are provided for delivering parametric and functional test signals at least functionally in parallel to each of the integrated circuit device test stations. Means are provided at each test station for selectively engaging the integrated circuit devices to apply the parametric and functional test signals to the integrated circuit device at that station, and to selectively isolate the device from the test signals. Means are provided for receiving an output from each test location in response to the test signals, and means for determining from the output the parameters of each tested integrated circuit device. In accordance with the invention, means are provided for sorting the tested integrated circuit devices according to their measured or tested parameters.

12 Claims, 2 Drawing Figures

APPARATUS FOR TESTING A PLURALITY OF INTEGRATED CIRCUITS IN PARALLEL

BACKGROUND OF THE INVENTION

1. Field of the Invention

This invention relates to improvements in integrated circuit testing apparatus or systems, and, more particularly, to a system for testing a plurality of integrated circuits simultaneously in parallel.

2. Description of the Prior Art

In the production of integrated circuits, considerable testing must be done to determine the integrated circuit parameters and whether the integrated circuit performs its intended function. In this regard, comprehensive testing regimens have been developed, the particular regimen used depending, of course, upon the type of integrated circuit being tested and the individual parameters of concern in a particular application. For example, in integrated circuit memories, tests are typically done for determining the speed of the memory. In addition, comprehensive complicated testing routines have been developed, typically to determine whether the memory itself has the capability at each memory address of retaining the memory state desired to be implaced or written into it, under conditions where adjacent cells in each direction containing the same or different state.

In performing the tests, various other testing objectives have been developed. For example, it is often important to identify integrated circuit memories which have a fast access or response time, and separate those memory circuits from other circuits in a common batch to be tested which exhibit slower response times. It is also important in improving production quality that devices exhibiting particular failure modes be isolated so that, for example, if a larger portion of devices in a particular production batch fail for one reason or another, the particular reason in the production process might be identified and cured to improve the overall production quality.

In the past, integrated circuits have usually been tested individually, one at a time. This is particularly time consuming, especially when a large number of tests need to be performed, especially in consideration of the ever increasing complexity and size of devices to be tested. For example, a simple 16K random access memory (RAM) takes about 12 to 24 seconds, or even more, to test, even with the test signals generated and applied by a computer. It will be appreciated that larger sized memories (and other complex integrated circuits) would take even larger times for testing. The state of the art presently is experiencing the production of larger memories in the range of 256K or more, requiring sometimes minutes to complete the comprehensive required testing.

It has been suggested in the past to parallel test integrated circuits, but such efforts have been unsuccessful, and economically impractical, primarily because the testing apparatuses which have been used were completely parallel, that is, with both the inputs and the outputs being respectively connected in parallel. Thus, the prior apparatuses tend to average the output consequently, a failed device could not be detected by an average which was out of range. The best that could be accomplished or determined was that one device in a set of devices under test failed, but the particular failed device could not be isolated from the rest. In addition, no one has accomplished parametric testing of devices.

A suggestion of parallel functional testing has been made by J. D. Lawrence, *Parallel Test With Burn-In For Enhanced Quality and Reliability,* Microelectronic Manufacturing and Testing, pp 22 et seq., January, 1982. It should be noted particularly that parametric testing is performed serially.

SUMMARY OF THE INVENTION

In light of the above, it is, therefore, an object of the invention to provide an improved system for testing integrated circuit devices.

It is another object of the invention to provide a system of the type described for testing a number of integrated circuits in parallel.

It is another object of the invention to provide a system of the type described for automatically testing integrated circuits in parallel and sorting the tested devices according to their individual parameters as determined by the tests performed.

It is another object of the invention to present a system of the type described for significantly increasing the throughput of the apparatus in testing integrated circuit devices.

It is another object of the invention to present a system of the type described which is economically feasible.

These and other objects, features, and advantages will become apparent to those skilled in the art from following detailed description when read in conjunction with the accompanying drawings and appended claims.

In accordance with a broad aspect of the invention, a system is presented for parametrically and functionally testing integrated circuit devices in parallel. At least one integrated circuit device receiving channel is provided for defining a plurality of integrated circuit device test stations therealong, and means are provided for delivering parametric and functional test signals at least functionally in parallel to each of the integrated circuit device test stations. Means are provided at each test station for selectively engaging the integrated circuit devices to apply the parametric and functional test signals to the integrated circuit device at that station, and to selectively isolate the device from the test signals. Means are provided for receiving an output from each test location in response to the test signals, and means for determining from the output the parameters of each tested integrated circuit device. In accordance with the invention, means are provided for sorting the tested integrated circuit devices according to their measured or tested parameters.

BRIEF DESCRIPTION OF THE DRAWING

The invention is illustrated in the accompanying drawings, in which.

In the various fingers of the drawing, like reference numerals are used to denote like or similar parts. Additionally, the sizes and dimensions of various parts have been exaggerated or distorted for clarity of illustration and ease of description.

DETAILED DESCRIPTION OF THE PREFERRED EMBODIMENT

Figure 1:
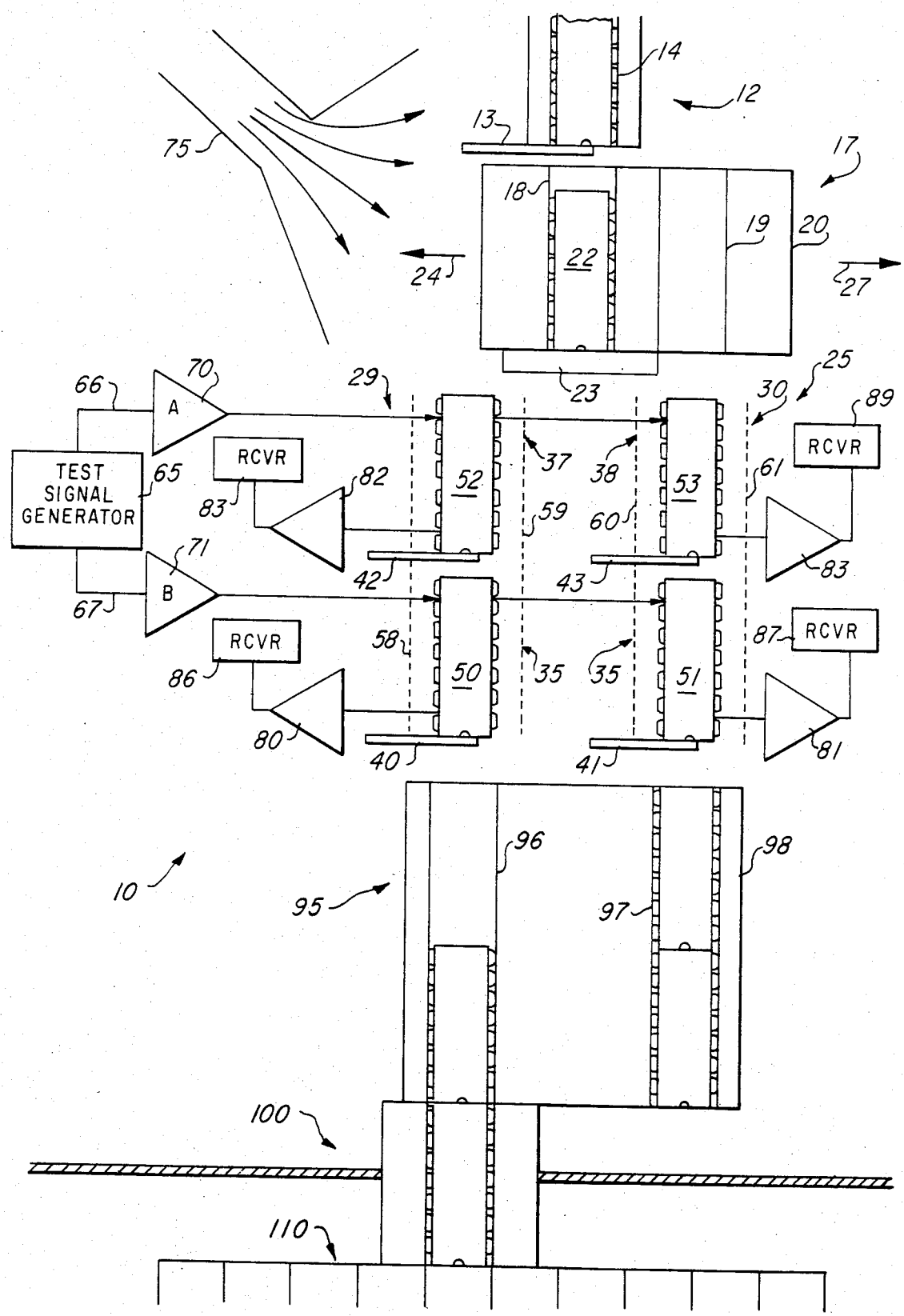
FIG. 1 is a box diagram illustrating the operation of the parallel testing system, in accordance with the invention.

The block diagram of FIG. 1 schematically represents the operation of a system 10 for testing a plurality of integrated circuit devices simultaneously and in parallel. The system 10 includes an intake chute 12 which receives a supply of integrated circuit devices to be tested from a source (not shown). The term "integrated circuit device" is used herein to denote generally any integrated circuit form, including die or unmounted bar, mounted bar, and encapsulated device forms. The embodiment illustrated in the drawings is described with particular reference to the encapsulated device form; however, as will be apparent to those skilled in the art, the invention can be equally advantageously employed with respect to any device form through appropriate modification of the device handling equipment. The discharge of the integrated circuits from the chute 12 is controlled by the pin 13, or other means. It should be noted that the system 10 of FIG. 1 is generally vertically orientated so that the integrated circuit devices to be tested fall under the influence of gravity between the various stages of the system, as below described. Thus, an integrated circuit device 14 within the chute assembly 12 is selectively dropped into the next stage below, which is a shuttle assembly 17 having two compartments 18 and 19 formed within a shuttle block 20. As the shuttle is moved from side to side by an appropriate moving means (not shown) the integrated circuit devices received within the respective chutes 18 and 19 are deposited one at a time into the underlying parallel test cavity 25. Thus, for example an integrated circuit device 22 within the channel 18 of the shuttle assemble 17 is held in place on a block 23 during the time that the channel 18 is located thereover. As the shuttle assemble 17 is moved in the direction of the arrow 24, the channel 18 clears the edge of block 23, allowing the contained integrated circuit device to fall or drop along one of two parallel tracks within the testing cavity 25. In a similar fashion, when the shuttle assembly is located at the left most position in the direction of the arrow 24, another integrated circuit device is dispensed from the supply chute 12 into its receiving channel 19. Thereafter, the shuttle assembly 17 is moved to the right, in the direction of the arrow 27, allowing the integrated circuit device contained within the channel 19 to drop into the testing cavity 25 within the opposite parallel testing track. This process is repeated until the testing cavity 25 has been filled to capacity with integrated circuit devices to be tested.

As inferred above the integrated circuit device test cavity 25 includes two parallel integrated circuit device receiving or handler tracks 29 and 30 into which the integrated circuit devices are received, and, by virtue of the alternating motion of the shuttle 17, the integrated circuit devices are located, in order, into one of four testing station locations 35, 36, 37, and 38, each to be held in position by retaining rods or pins 40-43, respectively. Thus, as shown, integrated circuit devices 50-53 are located in respective test stations 35-38. Each of the parallel tracks 29 and 30 includes a pair of contact elements or members 58 and 59 and 60 and 61, respectively, connected to carry appropriate test signals to and from the respective integrated circuit devices located at the test stations 35-38. The members 58-61 are carried on parallel rails (not shown) to be moveable toward and away from the integrated circuit packages 50-53 to contact their leads.

The test signals to be applied to the integrated circuits 50-53 are generated in a test signal generator 65, in a manner known in the art, depending on the type of integrated circuits being tested, the types of tests desired to be run, and so forth. The test signal generator 65 has two outputs provided on lines 66 and 67, carrying identical test signals. The test signals on output line 66 are conducted to an amplifier or driver 70 for application to the inputs of integrated circuits 52 and 53. Similarly, the test signals on output line 67 are conducted to an amplifier or driver 71 for application to the integrated circuits 50 and 51. Thus, the test signals applied to the integrated circuits 50-53 are electrically in parallel so that each of the integrated circuits under test receives essentially the identical test signals as the others. It should be noted that the geometry of the placement of the circuits to be tested is of importance so that lines carrying the test signals from the test signal generator 65 can be made of approximately the same length and character to insure that the various impedances found in the test application circuit to each of the integrated circuits under test is the same. Furthermore, the test stations 35-38 are located in close physical relationship to each other so that each of the integrated circuits being tested experiences the same temperature and environmental influences as each of the others being tested.

To insure that each of the devices under test is at the same temperature, a plenum 75 is provided to carry air at a desired test temperature from an appropriate source (not shown) to cool or warm the devices under test as well as those in the input chute 12 and shuttle 17 awaiting test. Diverters or diffusers (not shown) also may be provided at the output of the plenum 75 or within its air stream to insure even distribution of the air upon the devices, as needed.

The outputs from each of the integrated circuit devices 50-53 are conducted to respective output amplifiers 80, 81, 82, and 83, the outputs of which are directed to respective detectors or receivers 86-89.

As mentioned, the inputs to integrated circuit devices 50 and 51 are electrically inparallel, as are the inputs to integrated circuit devices 52 and 53. The signal source to the drivers 70 and 71 are identical, so that all four integrated circuit device inputs are functionally in parallel. In operation, the necessary functional and parametric tests are generated, and applied by the drivers 70 and 71 to each of the integrated circuit devices 50-53. If one of the devices, for example, integrated circuit device 51, is parametrically bad or otherwise fails, this will first show up as a failure on either integrated circuit device 50, integrated circuit device 51, or both, as indicated on their respective output receivers 86 and 87. In order to isolate the failure on the input pins it is necessary to isolate integrated circuit device 50 from integrated circuit device 51 and integrated circuit device 52 from integrated circuit device 53. This is done by opening either of the handler tracks 29 or 30. Thus, if integrated circuit device 51 is parametrically bad a parametric failure will appear as being either integrated circuit device 50 or integrated circuit device 51. If the handler track 29 is opened, integrated circuit devices 50 and 52 are isolated from the input signals. The failure does not disappear since the bad device, device 51, is still connected to the input. To confirm the test, the handler track 29 is then closed and the handler track 30 opened.

The testing is continued on integrated circuit devices 50 and 52. Integrated circuit device 51, therefore, can be stored as being parametrically bad. If desired, the integrated circuit device 50 can be sorted into a retest bin, to assure that it is completely parametrically sound.

After the testing process has been completed, the tested integrated circuit devices 50-53 are dropped into a queue 95, merely by pulling pins 40-43 within the testing cavitity 25. Thus, the integrated circuit devices 50-53 fall into receiving channels 96 and 97 within a gueue block 98 for sorting. An output shuttle assembly 100 is provided beneath the queue assembly 95 to receive the integrated circuit devices and to sort them to appropriate receiving bins 110. As shown, a plurality of receiving bins 110 are provided, so that, if desired, the tested integrated circuits devices can be sorted according to the test results delivered in the foregoing tests. For example, factors which can easily be sorted include memory response time, intermittently failing devices, totally failing devices, devices which appear shorted upon application of operating voltages, or any other test result criterion, as will be apparent to those skilled in the art.

Figure 2:
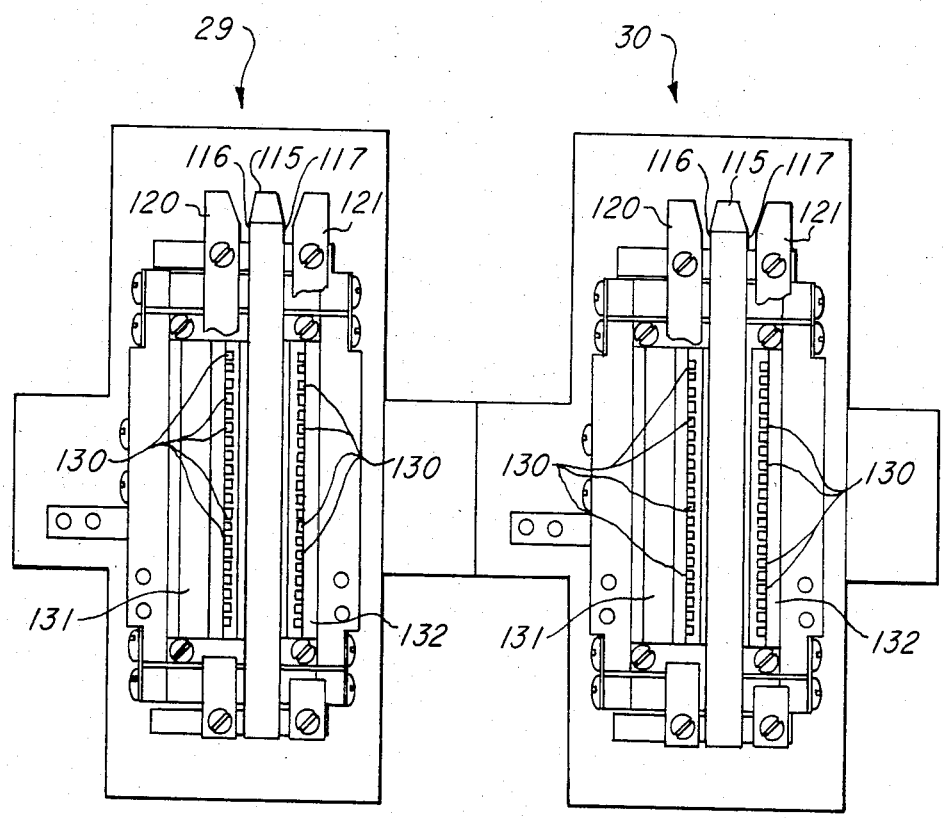
FIG. 2 is a plan view of an integrated circuit engaging apparatus for use in performing parallel tests on integrated circuit devices, in accordance with the invention.

With reference now particularly to FIG. 2, the details of the handler tracks 29 and 30 are shown. Thus, as shown, the handler tracks 29 and 30 are disposed with respect to each other to form two parallel adjacent integrated circuit device receiving channels. The integrated circuit devices (not shown) are guided upon guide bars 115 with the integrated circuit leads extending into channels 116 and 117. As shown, a pair of overlying rails on 120 and 121 may be provided to maintain the vertical orientation of the integrated circuit devices contained within the respective channels 29 and 30, if desired or needed, (retaining bars 120 and 121 being partially cut away in FIG. 2 for clarity of illustration).

With two integrated circuit packages or devices located in the channels 29 and 30, the leads of the properly positioned integrated circuit devices at the respective test stations within the channels 29 and 30 are adjacent, but not touching. The contracting members or elements 130. The members 130 are carried on respective bars or rails 131 and 132, which are spring activated to a normal position away from the integrated circuit devices leads as shown. Thus, in operation, when the respective bars or rails 131 and 132 are activated by a solenoid or other activating means (not shown) the various contacting members 130 are brought into electrically engaging contact with the leads of the integrated circuit devices contained within the respective channels 29 and 30. The tests on the integrated circuit devices can then be performed in the manner outlined above. Upon the conclusion of the test, the integrated circuit device retaining means (not shown) can be activated to allow the integrated circuit devices to drop or fall from the respective channels 29 and 30 to be subsequently sorted, as described above.

Although the invention has been described and illustrated with a certain degree of particularity, it is understood that the present disclosure has been made by way of example only and that numerous changes in the combination and arrangement of parts may be resorted to by those skilled in the art without departing from the spirit and the scope of the invention is hereinafter claimed.

We claim:

1. Apparatus for parametrically and functionally testing integrated circuit devices in parallel, comprising:
   at least one integrated circuit receiving channel defining a plurality of integrated circuit device test stations therealong;
   load means for automatically delivering via the integrated circuit receiving channel to each of the plurality of integrated circuit device test stations a separate integrated circuit device for testing;
   means for delivering parametric and functional test signals at least functionally in parallel to each of said integrated circuit device test stations;
   means at each of said test stations for selectively engaging the delivered integrated circuit device to apply the parameter test signals to the integrated circuit device at said test station;
   means for receiving an output from each test location in response to the test signals; and
   means for determining from said output the parameters of each tested integrated circuit device.

2. The apparatus of claim 1 further comprising means for sorting said integrated circuit devices in accordance with said determined output parameters.

3. The apparatus of claim 1 wherein said at least one parallel integrated circuit device receiving channel is a plurality of parallel tracks.

4. The apparatus of claim 1 wherein said at least one parallel integrated circuit device receiving channel is two parallel tracks.

5. The apparatus of claim 4 wherein said two tracks comprise four test stations.

6. The apparatus of claim 5 wherein said four test stations are symetrically located to minimize differences in input signal paths therebetween.

7. The apparatus of claim 1 further comprising means for maintaining each of the test stations at the same temperature.

8. The apparatus of claim 7 wherein said temperature maintaining means comprises a source of air at a desired test temperature and a plenum for distributing the air at least onto the test stations.

9. The apparatus of claim 1 wherein said means at each test station for selectively engaging said integrated circuit devices comprises:
   a guide bar on which are carried at least two integrated circuit devices;
   a plurality of integrated circuit device contacting members;
   and means for moving said device contacting members between engaging and disengaging positions of said integrated circuit devices.

10. The apparatus of claim 1 wherein the load means comprises an input shuttle to alternately load devices into the respective parallel integrated circuit receiving channels.

11. The apparatus of claim 2 wherein said means for sorting comprises:
   a queue;
   a shuttle to receive devices from said queue,
   and a plurality of bins over which said shuttle travels to dispense said integrated circuits into selected ones of said bins according to the test measurements.

12. A method of testing integrated circuit devices, comprising:
   automatically delivering to each member of a plurality of parallel connected integrated circuit test stations a separate integrated circuit device for testing;

providing parametric and functional test signals to the plurality of integrated circuit device test stations and to each delivered integrated circuit device thereby, monitoring output signals produced from each device in response to said test signals, selectively isolating a set of integrated circuit devices when the monitored output signals indicate a device has failed, and repeating said test steps of providing, monitoring and isolating until the failing device is identified.

* * * * *